(12) United States Patent
Angyal et al.

(10) Patent No.: US 9,859,208 B1
(45) Date of Patent: Jan. 2, 2018

(54) BOTTOM SELF-ALIGNED VIA

(71) Applicant: International Business Machines Corporation, Armonk, NY (US)

(72) Inventors: Matthew S. Angyal, Stormville, NY (US); Naftali E. Lustig, Croton on Hudson, NY (US); Rasit O. Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/268,604

(22) Filed: Sep. 18, 2016

(51) Int. Cl.
*H01L 21/768* (2006.01)
*H01L 23/522* (2006.01)
*H01L 23/528* (2006.01)

(52) U.S. Cl.
CPC .... *H01L 23/5226* (2013.01); *H01L 21/76831* (2013.01); *H01L 21/76843* (2013.01); *H01L 21/76895* (2013.01); *H01L 21/76898* (2013.01); *H01L 23/528* (2013.01)

(58) Field of Classification Search
CPC ............. H01L 21/768; H01L 21/76805; H01L 21/76829; H01L 23/5226; H01L 23/528; H01L 21/76898; H01L 21/76895; H01L 21/76843; H01L 21/76831; H01L 2/76829
USPC ........................................................ 257/774
See application file for complete search history.

(56) References Cited

U.S. PATENT DOCUMENTS

| 5,512,514 A | 4/1996 | Lee |
| 5,614,765 A | 3/1997 | Avanzino et al. |
| 7,602,066 B2 | 10/2009 | Brakensiek et al. |
| 7,696,085 B2 | 4/2010 | Li et al. |
| 8,298,943 B1 | 10/2012 | Arnold et al. |
| 8,614,144 B2 | 12/2013 | Kato |
| 8,895,431 B2 | 11/2014 | Harada et al. |
| 9,219,007 B2 | 12/2015 | Chen et al. |
| 2001/0002331 A1 | 5/2001 | Miyata |
| 2003/0003404 A1* | 1/2003 | Lee ................... H01L 21/76829 430/314 |
| 2008/0179584 A1* | 7/2008 | Lung ...................... H01L 45/06 257/4 |

(Continued)

OTHER PUBLICATIONS

N. Aoi et al., "A novel clustered hard mask technology for Dual Damascene multilevel interconnects with self-aligned via formation using an organic low k dielectric," Symposium on VLSI Technology, 1999, pp. 41-42.

(Continued)

*Primary Examiner* — Alexander Oscar Williams
(74) *Attorney, Agent, or Firm* — Law Offices of Ira D. Blecker, P.C.

(57) ABSTRACT

A method for an interconnect structure including: forming a hard mask layer on a semiconductor substrate having a wiring line; patterning the hard mask layer to form a patterned hard mask layer having a hard mask layer opening; depositing a dielectric stack on the patterned hard mask layer and in the hard mask layer opening; patterning the dielectric stack to form a via opening aligned with the hard mask layer opening and to expose the wiring line through the via opening and the hard mask layer opening, a bottom of the via opening defined by the hard mask layer having the hard mask layer opening; and filling the via opening and the hard mask layer opening with a metal to form a via in contact with the wiring line.

20 Claims, 8 Drawing Sheets

(56) References Cited

U.S. PATENT DOCUMENTS

| | | | |
|---|---|---|---|
| 2009/0206489 A1* | 8/2009 | Li | H01L 21/0337 257/774 |
| 2013/0307115 A1* | 11/2013 | Filippi | H01L 23/5252 257/530 |
| 2015/0130073 A1* | 5/2015 | Sung | H01L 23/5226 257/774 |
| 2016/0042114 A1 | 2/2016 | Greco et al. | |
| 2016/0163589 A1* | 6/2016 | Lee | H01L 21/76807 438/626 |
| 2017/0025346 A1* | 1/2017 | Yao | H01L 23/5226 |

OTHER PUBLICATIONS

T-H. Fu et al., "Robust TiN HM process to overcome under etch issue for SAV scheme on 14nm node," Interconnect Technology Conference and Materials for Advanced Metallization Conference (IITC/MAM), 2015, pp. 13-16.

* cited by examiner

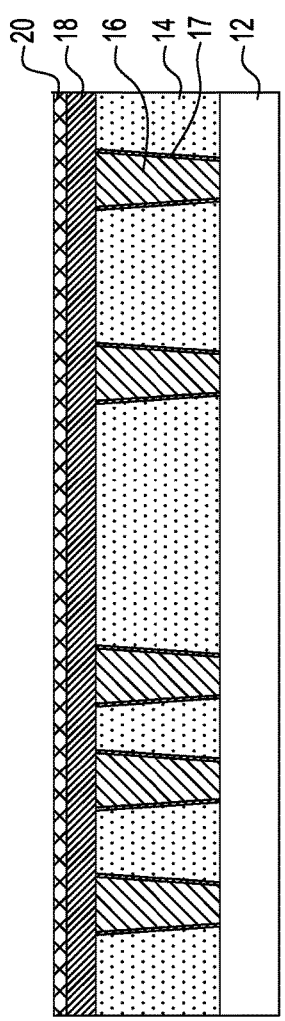
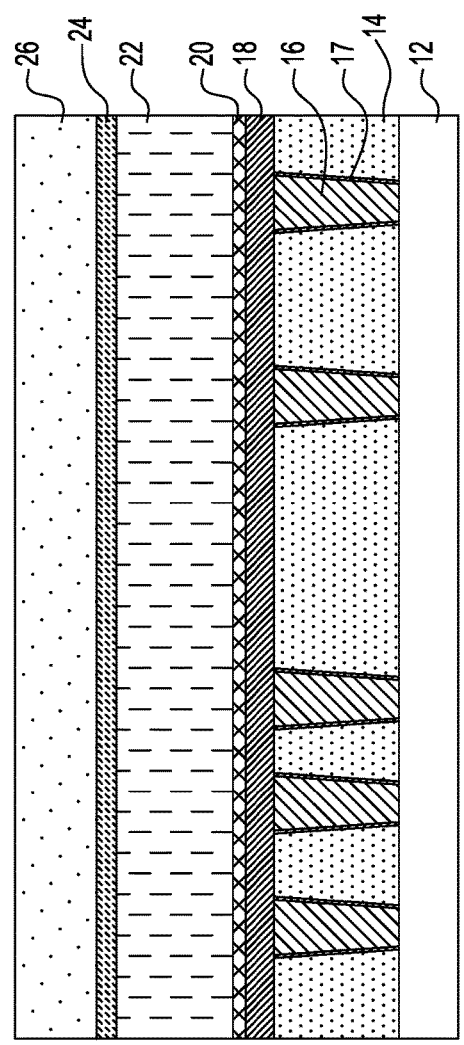
FIG. 1
FIG. 2

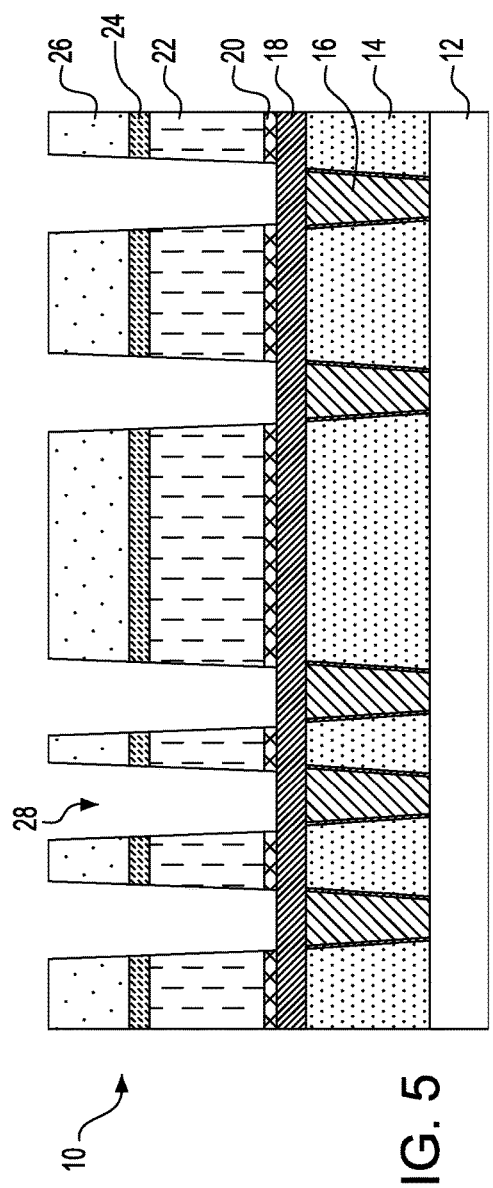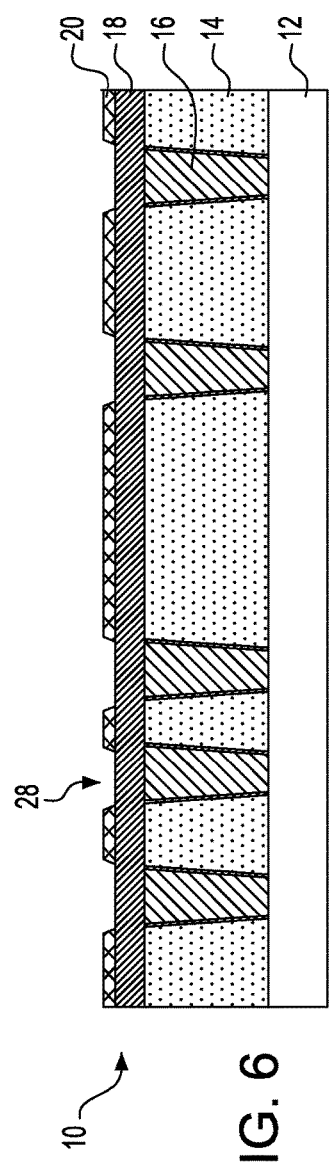

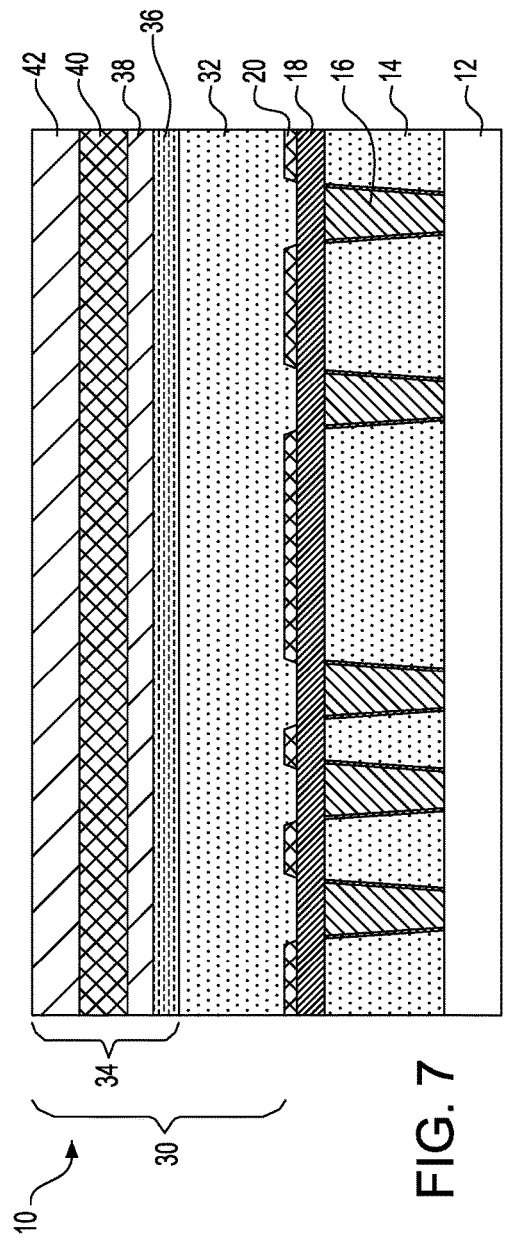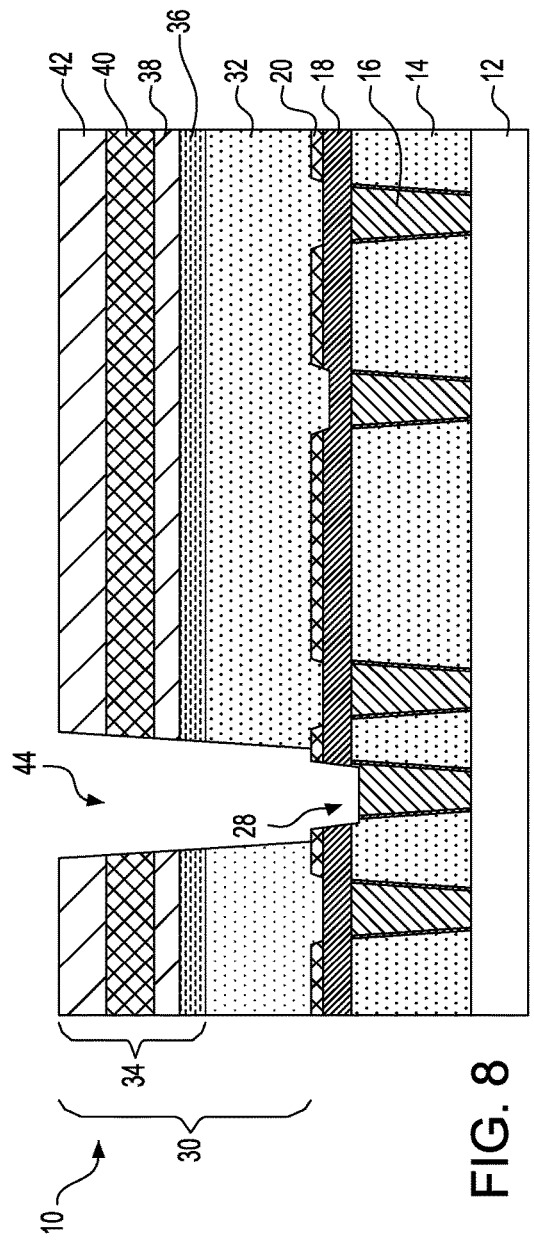
FIG. 7
FIG. 8

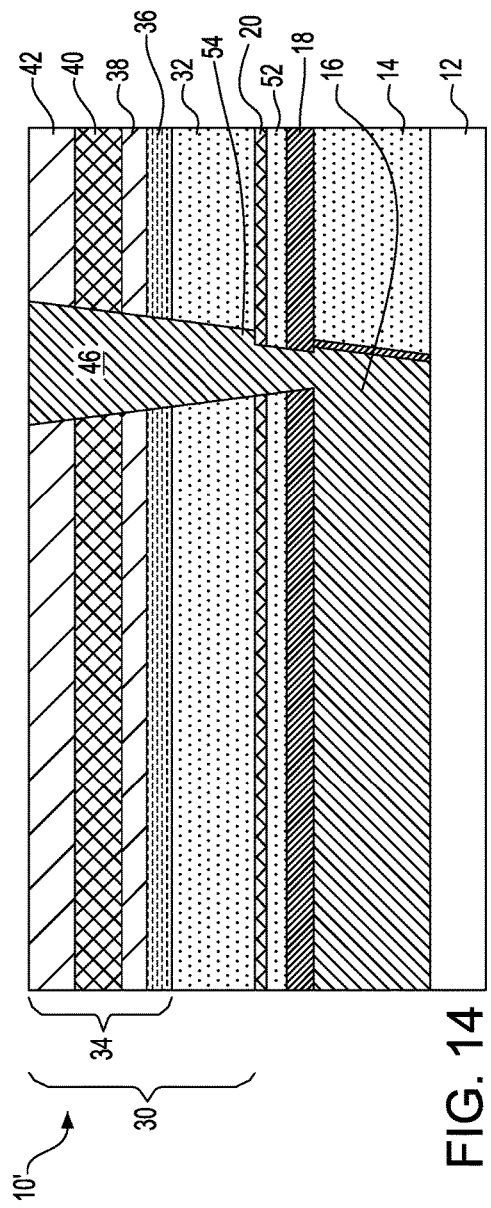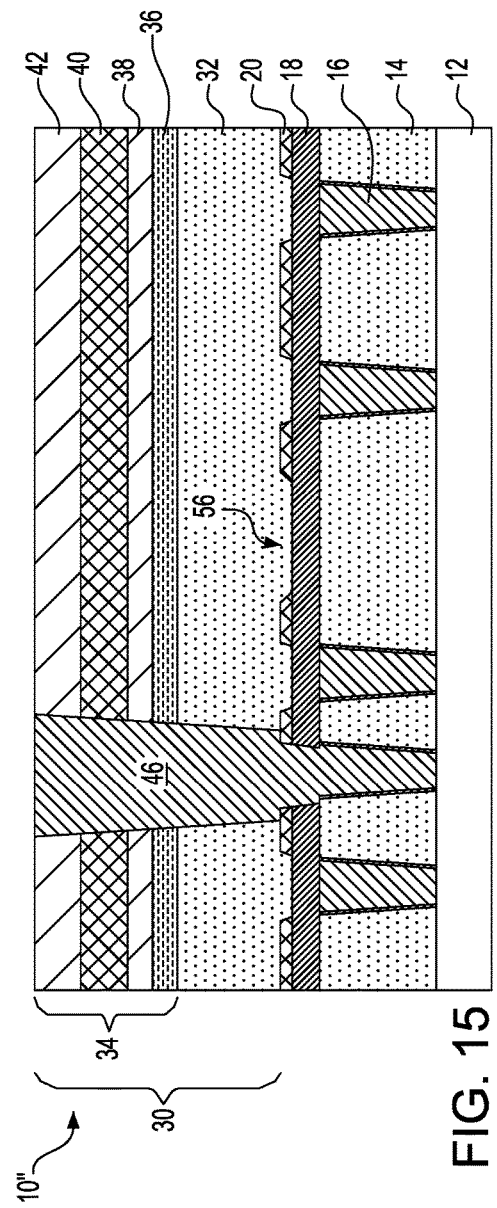

BOTTOM SELF-ALIGNED VIA

BACKGROUND

The present exemplary embodiments pertain to self-aligned vias in an interconnect structure and, more particularly, relate to self-aligned vias which are aligned to a bottom wiring line.

Via alignment to a wiring line is critical to the integrity of a semiconductor chip. As semiconductor device dimensions get smaller, via alignment becomes more difficult. In the past, there were redundant vias but in newer technologies such as in 14 nanometer (nm) technologies and below, the number of redundant vias are substantially reduced.

To solve the problem of via alignment, the vias may be made bigger to make alignment easier. However, with the above newer technologies, enlarging the vias may no longer be possible due to shorting concerns with neighbor vias and wiring lines.

BRIEF SUMMARY

The various advantages and purposes of the exemplary embodiments as described above and hereafter are achieved by providing, according to an aspect of the exemplary embodiments, a method for an interconnect structure comprising: forming a hard mask layer on a semiconductor substrate having a wiring line; patterning the hard mask layer to form a patterned hard mask layer having a hard mask layer opening; depositing a dielectric stack on the patterned hard mask layer and in the hard mask layer opening; patterning the dielectric stack to form a via opening aligned with the hard mask layer opening and to expose the wiring line through the via opening and the hard mask layer opening, a bottom of the via opening defined by the hard mask layer having the hard mask layer opening; and filling the via opening and the hard mask layer opening with a metal to form a via in contact with the wiring line.

According to another aspect of the exemplary embodiments, there is provided a method for an interconnect structure on a semiconductor substrate comprising: forming a diffusion barrier cap on a wiring line, the wiring line being in a back end of the line portion of the semiconductor substrate; forming a hard mask layer on the wiring line; patterning the hard mask layer to form a patterned hard mask layer having a hard mask layer opening; depositing a dielectric stack on the patterned hard mask layer and in the hard mask layer opening; patterning the dielectric stack to form a via opening aligned with the hard mask layer opening and to expose the wiring line through the via opening and the hard mask layer opening, a bottom of the via opening defined by the hard mask layer having the hard mask layer opening; and filling the via opening and the hard mask layer opening with a metal to form a via in contact with the wiring line.

According to a further aspect of the exemplary embodiments, there is provided a bottom self-aligned via structure comprising: a semiconductor substrate having a wiring line; a patterned hard mask layer on the wiring line, the patterned hard mask layer having a hard mask layer opening aligned with the wiring line; a patterned dielectric stack on the patterned hard mask layer, the patterned dielectric stack having a via opening aligned with the hard mask layer opening, a bottom of the via opening defined by the hard mask layer having the hard mask layer opening; and a metal that fills the via opening and the hard mask layer opening to form a via in contact with the wiring line, a portion of the via being in direct contact with the hard mask layer and having a width that is wider than the hard mask layer opening.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 11 are cross sectional views illustrating an exemplary embodiment of forming a bottom self aligned via in which:

FIG. 1 illustrates a semiconductor structure having a semiconductor substrate, a back end of the line (BEOL) layer and a hard mask layer;

FIG. 2 illustrates the semiconductor structure of FIG. 1 in which patterning layers including a photoresist are deposited on the hard mask layer;

FIG. 3 illustrates the semiconductor structure of FIG. 2 in which the photoresist is patterned;

FIG. 4 illustrates the semiconductor structure of FIG. 3 in which the remaining patterning layers are patterned;

FIG. 5 illustrates the semiconductor structure of FIG. 4 in which the hard mask layer is etched;

FIG. 6 illustrates the semiconductor structure of FIG. 5 in which the patterning layers have been stripped to reveal the patterned hard mask layer;

FIG. 7 illustrates the semiconductor structure of FIG. 6 in which a dielectric stack has been deposited on the patterned hard mask layer;

FIG. 8 illustrates the semiconductor structure of FIG. 7 in which the dielectric stack has been pattered and etched to reveal openings aligned with openings in the hard mask layer;

FIG. 9 illustrates the semiconductor structure of FIG. 8 in which a metal has been deposited in the openings in the dielectric stack and the hard mask layer to form a bottom self aligned via;

FIG. 10 is a cross sectional view of the semiconductor structure of FIG. 8 in which the semiconductor structure has been rotated 90 degrees; and FIG. 11 is a cross sectional view of the semiconductor structure of FIG. 9 in which the semiconductor structure has been rotated 90 degrees.

FIGS. 12 to 14 are cross sectional views illustrating another exemplary embodiment of forming a bottom self aligned via in which:

FIG. 12 illustrates the hard mask layer spaced from the BEOL layer;

FIG. 13 illustrates the semiconductor structure of FIG. 12 with a bottom self aligned via; and FIG. 14 is a cross sectional view of the semiconductor structure of FIG. 13 in which the semiconductor structure has been rotated 90 degrees.

FIG. 15 is a cross sectional view of another exemplary embodiment of forming a bottom self aligned via in which the patterned hard mask layer is situated only around the bottom self aligned via.

DETAILED DESCRIPTION

Figure 3:
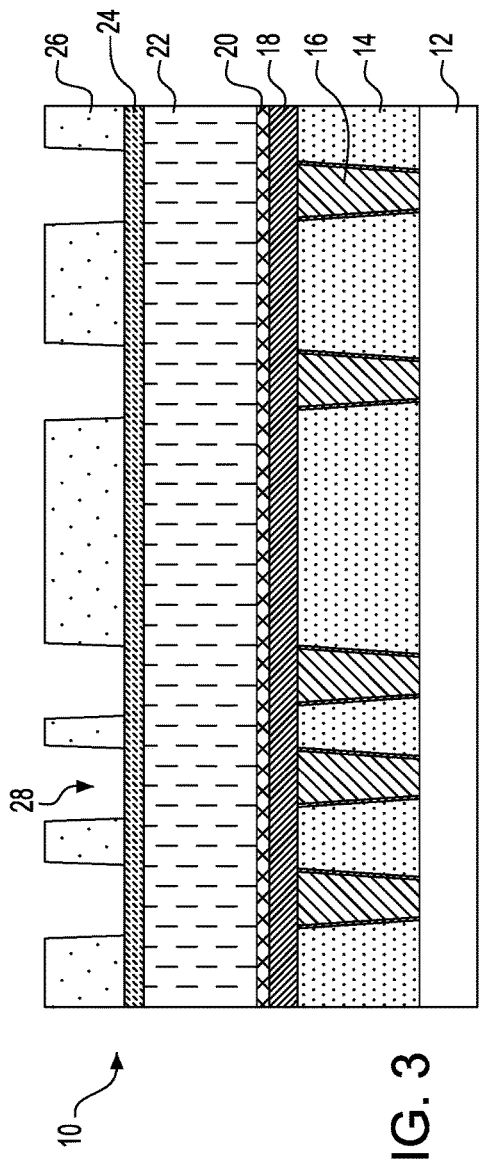

As used herein, a wiring line refers to a conductive structure that extends in a horizontal direction in the same wiring level. As used herein, a via refers to a conductive structure that extends in a vertical direction from a wiring line. As used herein, an interconnect structure refers to a conductive structure including at least one wiring line and one via.

Self aligned vias extending between two wiring lines have previously not been aligned to the bottom wiring line which may lead to reliability issues as well as shorting to other interconnects. The exemplary embodiments pertain to a bottom self aligned via that is aligned with the bottom wiring line.

Referring to the Figures in more detail, and particularly referring to FIGS. 1 to 11, there are illustrated cross sectional views of an exemplary embodiment of forming a bottom self aligned via. In FIG. 1, semiconductor structure 10 is illustrated having a semiconductor substrate 12 which may have a plurality of devices on it. The semiconductor substrate 12 includes the front end of the line (FEOL) components such as transistors, capacitors, and other components, including middle of the line (MOL) and other BEOL layers, which are not shown as such components are not germane to the exemplary embodiments.

On the semiconductor substrate 12 may be formed a plurality of back end of the line (BEOL) wiring layers which may provide a redistribution of electronic signals or other function. One such BEOL wiring layer is shown in FIGS. 1 to 11 but it should be understood that there usually will be additional BEOL wiring layers on the semiconductor substrate 12. The BEOL wiring layer shown in FIGS. 1 to 11 may be the first wiring layer or a subsequent wiring layer.

The BEOL wiring layer may include wiring lines 16 surrounded by a dielectric 14. The dielectric 14 may include, for the purpose of illustration and not limitation, a silicon oxide, OMCTS (octamethylcyclotetrasiloxane), SiCOH or porous SiCOH In one preferred exemplary embodiment, the wiring lines 16 may be copper and may include a diffusion barrier liner 17, such as tantalum/tantalum nitride prior to deposition of the copper. On top of the wiring lines 16 and dielectric 14 is an optional dielectric cap layer 18 which prevents diffusion of metallic impurities through the optional dielectric cap layer 18, if present. For the purpose of illustration and not limitation, the optional dielectric cap layer 18 may have a thickness of about 20 nm. The optional dielectric cap layer 18 may include materials such as NBLoK ($SiC_xN_yH_z$).

Over the optional dielectric cap layer 18 may be a hard mask layer 20. For the purpose of illustration and not limitation, the hard mask layer 20 may have a thickness of 3 to 5 nm and may include materials such as OMCTS HM (hardmask), hafnium oxide or aluminum oxide. OMCTS may differ from OMCTS HM in deposition conditions, dielectric constant, or material ratios. The main purpose is to ensure that the etch characteristics of OMCTS are different from the etch characteristics of OMCTS HM. OMCTS HM may be more difficult to etch, for example, or may require a different etch chemistry than OMCTS.

In a preferred exemplary embodiment, the hard mask layer 20 is in direct contact with the optional dielectric cap layer 18, if present.

In the following steps illustrated in FIGS. 2 to 6, the hard mask layer 20 is patterned to form openings in the hard mask layer 20. Over the hard mask layer 20 may be deposited a silicon-based polymer layer 22 followed by an antireflective coating (ARC) 24 and then photoresist 26 as shown in FIG. 2.

In FIG. 3, the photoresist 26 is exposed and developed to form openings 28.

Figure 4:
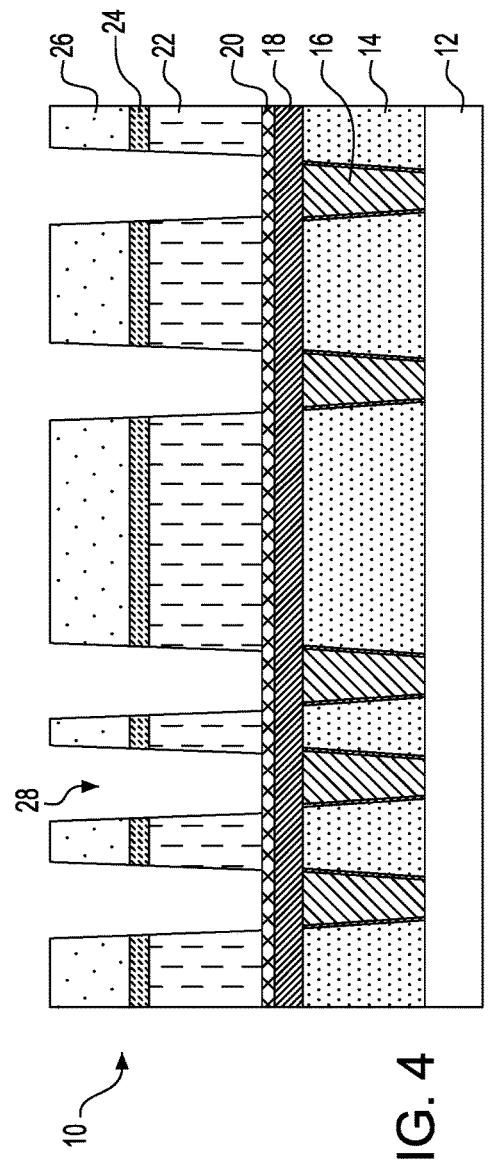
Figure 9:
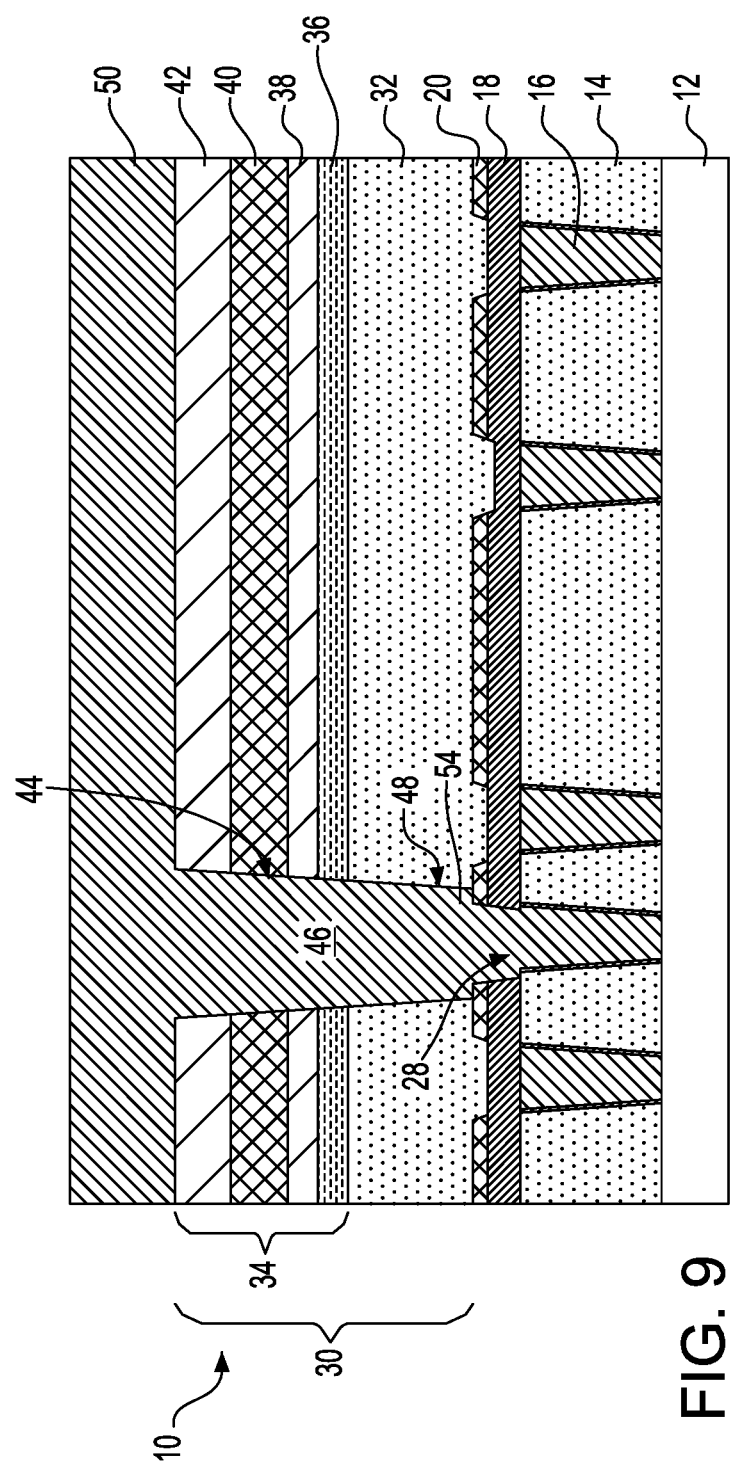

Then, as shown in FIG. 4, the ARC 24 and silicon-based polymer layer 22 are etched such as by reactive ion etching (RIE) to extend the openings 28 down to the hard mask layer 20. During this RIE step, the hard mask layer 20 may be partially etched but not sufficiently to extend the openings 28 through the hard mask layer 20.

In FIG. 5, the hard mask layer 20 may be further etched by a process such as RIE, using different etch chemistry than the RIE in FIG. 4, to extend the openings 28 through the hard mask layer 20.

The silicon-based polymer 22, ARC 24 and photoresist 26 may be conventionally stripped to result in the structure 10 shown in FIG. 6. The optional dielectric cap layer 18, if present, would be exposed through the openings 28 in the patterned hard mask layer 20. If the optional dielectric cap layer 18 is not present, then the wiring lines 16 would be exposed through the openings 28 in the patterned hard mask layer 20.

Over the patterned hard mask layer 20 may be deposited a dielectric stack 30 which may further include a dielectric material 32 and a stack 34 of hard mask layers as shown in FIG. 7. For the purpose of illustration and not limitation, the dielectric material 32 may be about 104 nm thick and include materials such as OMCTS. For the purpose of illustration and not limitation, the stack 34 of hard mask layers may include an approximate 5 nm thick layer of OMCTS HM 36, an approximate 15 nm thick layer of TEOS-HM (tetraethyl orthosilicate) 38, an approximate 30 nm thick layer of a metal hard mask such as titanium nitride 40 and an approximate 40 nm thick layer of TEOS HM 42.

Referring now to FIG. 8, the dielectric stack 30 has been lithographically patterned and etched by a process such as that previously described with respect to FIGS. 2 to 6. Through the lithographic processing, openings 44 in the dielectric stack 30 are formed. The openings 44 are aligned with the openings 28 in the hard mask layer 20. The underlying optional dielectric cap layer 18, if present, may be further etched, such as by a RIE process, through the openings 28 in the hard mask layer 20 to extend the openings 28 through the optional dielectric cap layer 18, if present. The wiring lines 16 are exposed through the openings 28 in the optional dielectric cap layer 18 and the hard mask layer 20 and through the openings 44 in the dielectric stack 30.

Thereafter, a metallic material may be deposited within the openings 28 in the optional dielectric cap layer 18 and the hard mask layer 20 and through the openings 44 in the dielectric stack 30 to form via 46. For the purpose of illustration and not limitation, the via 46 may be copper. Although not shown, the via 46 may have a liner of, for example, tantalum/tantalum nitride prior to deposition of the copper.

While the processing to form only one via is shown in the Figures, it should be understood that there may be further processing so that there is a via for every wiring line. These additional vias are not shown for clarity.

It should be noted that the bottom 48 of the via 46 is self aligned to the wiring line 16 by the openings 28 in the hard mask layer 20.

In a subsequent process, a second wiring line 50 may be deposited on dielectric stack 30 to form a next wiring level.

Figure 10:
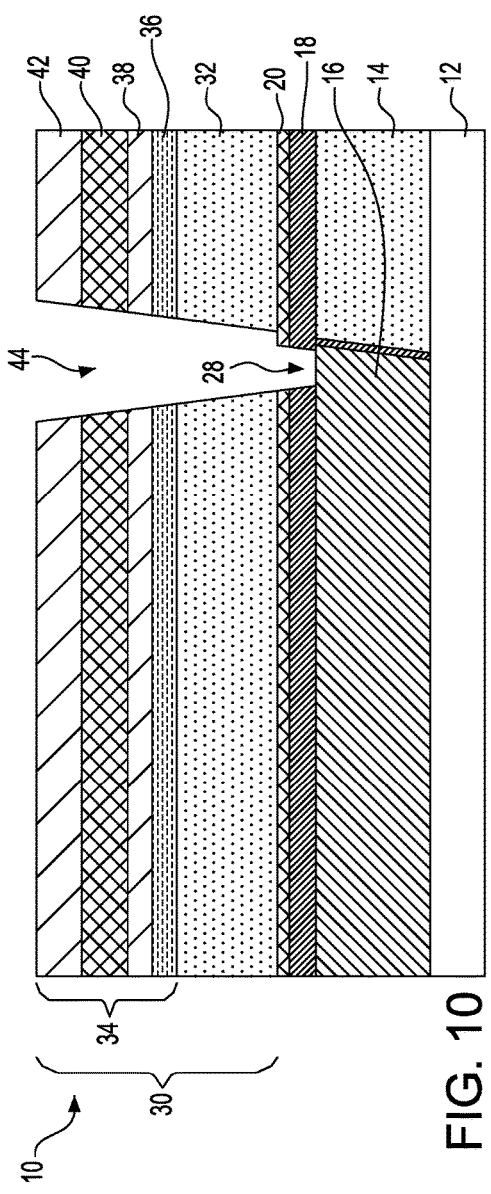
Figure 11:
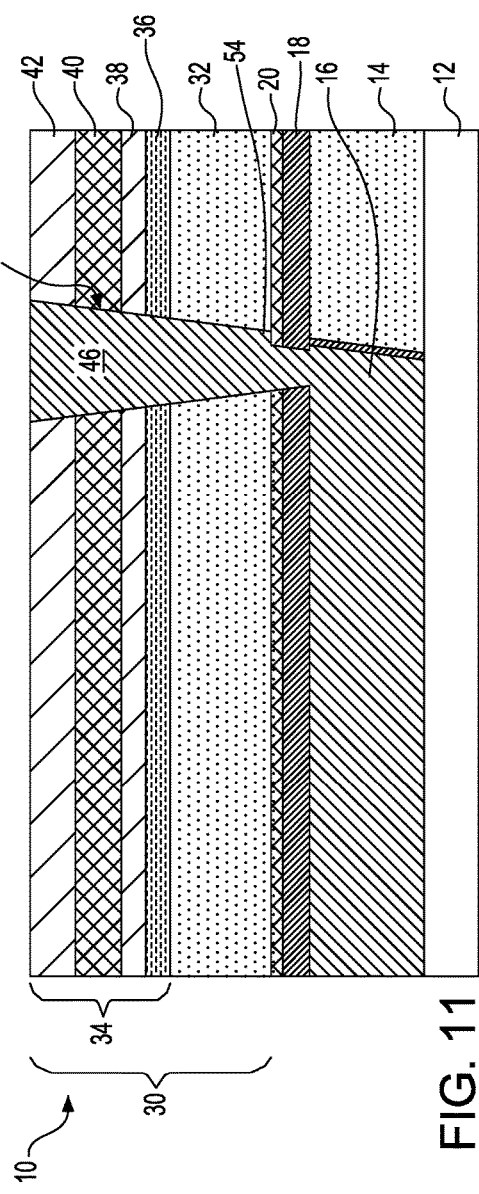

Up to this point, all the previous cross sectional views illustrated the cross sections of the wiring lines 16 so that essentially the ends of the wiring lines 16 are viewed. That is, the wiring lines 16 are viewed as coming out of the page. FIGS. 10 and 11 show the semiconductor structure 10 rotated 90 degrees so that the wiring lines 16 are within the plane of the page. Due to the processing of the exemplary embodiments a kink 54 in the via 46 may be formed. This kink 54 is also visible on both sides of the via 46 in FIG. 9. The kink 54 is a part of the via 46 that is in contact with hard mask layer 20 but is wider than opening 28 in hard mask layer 20.

Figure 12:
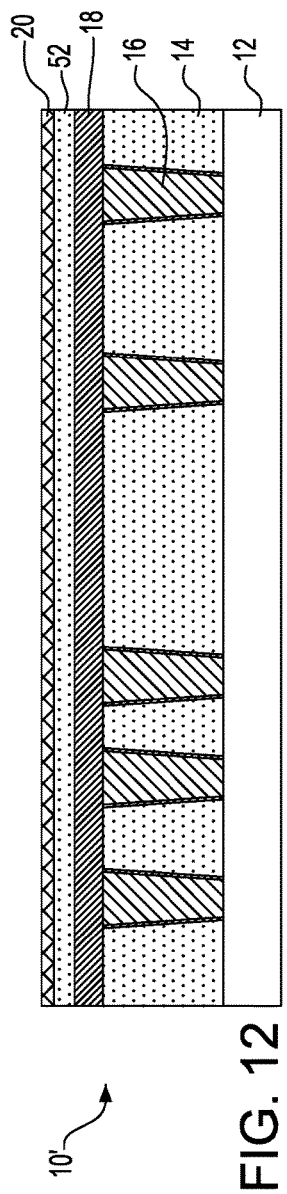
Figure 13:
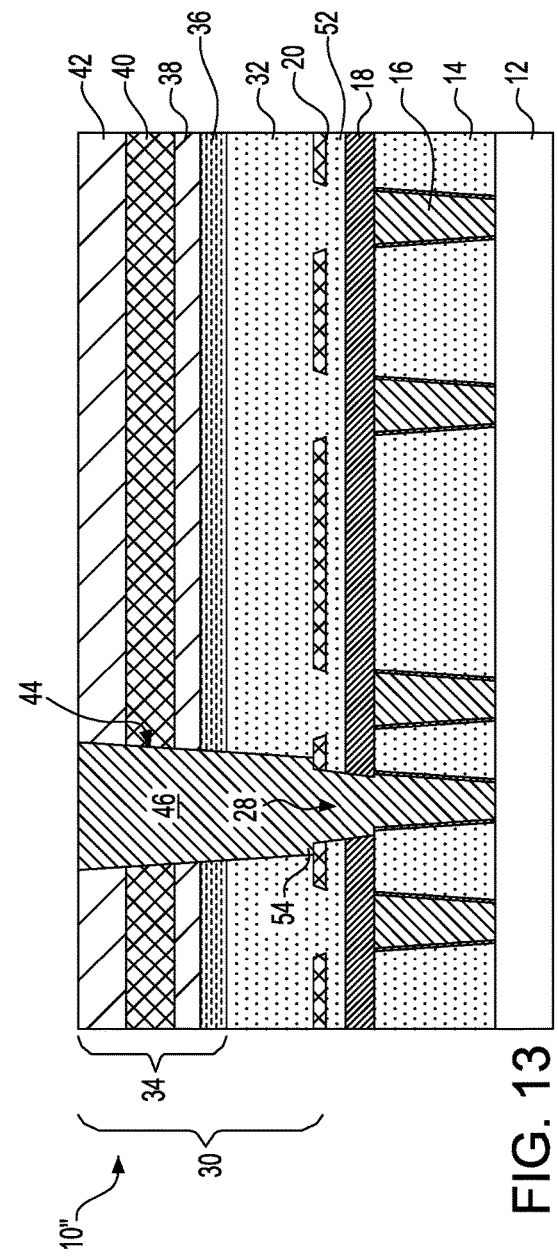

Another exemplary embodiment of a semiconductor structure 10' is illustrated in FIGS. 12 to 14. FIGS. 12 and 13 show a cross sectional view where the cross sections of the wiring lines are visible. FIG. 14 shows the semiconductor structure rotated 90 degrees to show just the one wiring line 16.

In semiconductor structure 10', the hard mask layer 20 is spaced from the optional dielectric cap layer 18 by about 3 to 5 nm as shown in FIG. 12. This space may be filled with a dielectric material such as OMCTS.

In FIG. 13, the dielectric stack 30 has been deposited over the hard mask layer 20 and patterned to form openings 44 which are then filled with a metallic material, preferably copper, to result in via 46.

FIGS. 13 and 14 show that the kink 54 in the via is now spaced further from the optional dielectric cap layer 18, if present.

A further exemplary embodiment of a semiconductor structure 10" is illustrated in FIG. 15. The exemplary embodiment illustrated in FIG. 15 is similar to the exemplary embodiment illustrated in FIGS. 1 to 11 with the exception that the semiconductor structure 10" has the hard mask layer 20 situated only around the wiring lines 16 and the subsequently formed vias 46. The hard mask layer 20 away from the wiring lines 16, such as in area 56, may be removed in the patterning described previously with respect to FIGS. 2 to 6.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method for an interconnect structure comprising:
   forming a hard mask layer on a semiconductor substrate having a wiring line;
   patterning the hard mask layer to form a patterned hard mask layer having a hard mask layer opening;
   depositing a dielectric stack on the patterned hard mask layer and in the hard mask layer opening;
   patterning the dielectric stack to form a via opening aligned with the hard mask layer opening and to expose the wiring line through the via opening and the hard mask layer opening, a bottom of the via opening adjacent to the hard mask layer and having an opening larger than the hard mask layer opening; and
   filling the via opening and the hard mask layer opening with a metal to form a via in contact with the wiring line, the bottom of the via opening being filled to be a portion of the via in direct contact with the hard mask layer and having a width that is wider than the hard mask layer opening.

2. The method of claim 1 further comprising a diffusion barrier cap between the hard mask layer and the wiring line.

3. The method of claim 2 wherein the hard mask layer is in direct contact with the diffusion barrier cap.

4. The method of claim 1 further comprising a dielectric layer between the hard mask layer and the diffusion barrier cap.

5. The method of claim 4 wherein the hard mask layer is in direct contact with the dielectric layer and the dielectric layer is in direct contact with the diffusion barrier cap.

6. The method of claim 2 wherein the hard mask layer is spaced from the diffusion barrier cap by 3 to 5 nanometers such that the hard mask layer is at the bottom of the via opening and the bottom of the via.

7. The method of claim 1 wherein the interconnect structure is in the back end of the line.

8. The method of claim 7 further comprising a second wiring line in contact with a top of the via.

9. A method for an interconnect structure on a semiconductor substrate comprising:
   forming a diffusion barrier cap on a wiring line, the wiring line being in a back end of the line portion of the semiconductor substrate;
   forming a hard mask layer on the wiring line;
   patterning the hard mask layer to form a patterned hard mask layer having a hard mask layer opening;
   depositing a dielectric stack on the patterned hard mask layer and in the hard mask layer opening;
   patterning the dielectric stack to form a via opening aligned with the hard mask layer opening and to expose the wiring line through the via opening and the hard mask layer opening, a bottom of the via opening adjacent to the hard mask layer and having an opening larger than the hard mask layer opening; and
   filling the via opening and the hard mask layer opening with a metal to form a via in contact with the wiring line, the bottom of the via opening being filled to be a portion of the via in direct contact with the hard mask layer and having a width that is wider than the hard mask layer opening.

10. The method of claim 9 wherein the hard mask layer is in direct contact with the diffusion barrier cap.

11. The method of claim 10 further comprising a dielectric layer between the hard mask layer and the diffusion barrier cap.

12. The method of claim 11 wherein the hard mask layer is in direct contact with the dielectric layer and the dielectric layer is in direct contact with the diffusion barrier cap.

13. The method of claim 9 wherein the hard mask layer is spaced from the diffusion barrier cap by 3 to 5 nanometers such that the hard mask layer is at the bottom of the via opening and the bottom of the via.

14. The method of claim 9 further comprising a second wiring line in contact with a top of the via.

15. A bottom self-aligned via structure comprising:
   a semiconductor substrate having a wiring line;
   a patterned hard mask layer on the wiring line, the patterned hard mask layer having a hard mask layer opening aligned with the wiring line;
   a patterned dielectric stack on the patterned hard mask layer, the patterned dielectric stack having a via opening aligned with the hard mask layer opening, a bottom of the via opening defined by the hard mask layer having the hard mask layer openings;
   a metal that fills the via opening and the hard mask layer opening to form a via in contact with the wiring line, the bottom of the via opening being filled to be a portion of the via in direct contact with the hard mask layer and having a width that is wider than the hard mask layer opening.

16. The structure of claim 15 further comprising a diffusion barrier cap between the hard mask layer and the wiring line.

17. The structure of claim 16 wherein the hard mask layer is in direct contact with the diffusion barrier cap.

18. The structure of claim 16 wherein the hard mask layer is spaced from the diffusion barrier cap.

19. The method of claim 1 wherein patterning the hard mask layer occurs before depositing the dielectric stack and before patterning the dielectric stack.

20. The method of claim 9 wherein patterning the hard mask layer occurs before depositing the dielectric stack and before patterning the dielectric stack.

* * * * *